United States Patent [19]

Maney et al.

[11] Patent Number: 4,674,939
[45] Date of Patent: Jun. 23, 1987

[54] SEALED STANDARD INTERFACE APPARATUS

[75] Inventors: George A. Maney, Palo Alto; Andrew W. O'Sullivan, Gilroy; W. George Faraco, Saratoga, all of Calif.

[73] Assignee: ASYST Technologies, Fremont, Calif.

[21] Appl. No.: 635,384

[22] Filed: Jul. 30, 1984

[51] Int. Cl.4 .................. B65B 69/00; B65G 65/34
[52] U.S. Cl. ............................ 414/292; 414/217; 414/411; 414/422
[58] Field of Search ............... 414/287, 292, 217, 221, 414/222, 411, 403, 414, 422, 291, 303, 331, 416, 404-405, 592, 8; 220/211, 326, 85 B, 403, 404; 206/216, 328, 445, 454, 499, 501; 312/1, 10, 21, 24, 31, 117, 296, 312

[56] References Cited

U.S. PATENT DOCUMENTS

| | | | |
|---|---|---|---|
| 1,964,114 | 6/1934 | Gerlach et al. | 220/326 X |
| 3,666,338 | 5/1972 | Russell | 220/326 X |
| 3,729,121 | 4/1973 | Cannon | 414/414 X |
| 4,119,263 | 10/1978 | Cuthbertson et al. | 414/414 X |
| 4,208,159 | 6/1980 | Uehara et al. | 414/287 X |
| 4,343,584 | 8/1982 | Hudgins | 414/222 |
| 4,411,575 | 10/1983 | Miller | 414/217 |
| 4,412,771 | 11/1983 | Gerlach et al. | 414/222 X |
| 4,478,327 | 10/1984 | Siniscal et al. | 414/414 X |
| 4,498,833 | 2/1985 | Hertel | 414/217 |
| 4,520,921 | 6/1985 | Vissing | 220/326 X |
| 4,532,970 | 8/1985 | Tullis et al. | 414/217 X |
| 4,534,389 | 8/1985 | Tullis | 414/217 X |

FOREIGN PATENT DOCUMENTS 276962 8/1951 Fed. Rep. of Germany ...... 220/326

OTHER PUBLICATIONS

"SMIF: A Technology for Wafer Cassette Transfer in VLSI Manufacturing" by Mihir Parikh and Ulrich Kaemph, Solid State Technology, Jul. 4, 1984.

Primary Examiner—Joseph E. Valenza
Assistant Examiner—David A. Bucci
Attorney, Agent, or Firm—Fliesler, Dubb, Meyer & Lovejoy

[57] ABSTRACT

The present invention is an apparatus for maintaining articles, such as semiconductor wafers clean. The wafers or other articles to be processed are placed in a box having first and second regions for making first and second seals. A box door seals the articles into the box. The box has a second region for making the second seal and has a third region for making a third seal. The box is used to transport the wafers to a port in the canopy of the processing equipment. The port is adapted for receiving the box and box door and for transferring the box door and the contents of the box into a region beneath the canopy. The canopy has a first region for making the first seal with the box. Also, the canopy has a fourth region surrounding the port for making a fourth seal. A port door is provided for closing the canopy port when no box is present. The port door has a second region for making the second seal with the box and has a fourth region for making the fourth seal with the canopy. A box door latch is provided for latching the box door to the box whereby the second seal is made and released in the second region between the box door and the box by operation of the box door latch. A box latch is provided for latching the box to the canopy whereby the first seal is made or released in the first region between the box and the canopy by the operation of the box latch.

11 Claims, 15 Drawing Figures

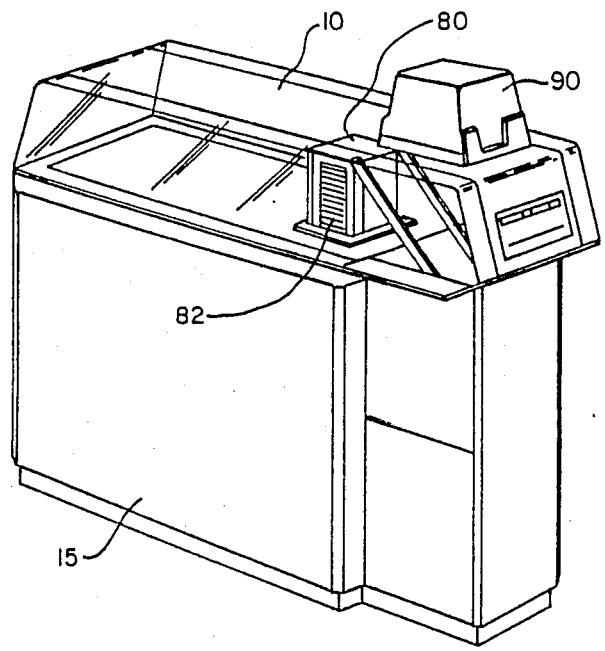
FIG.—1
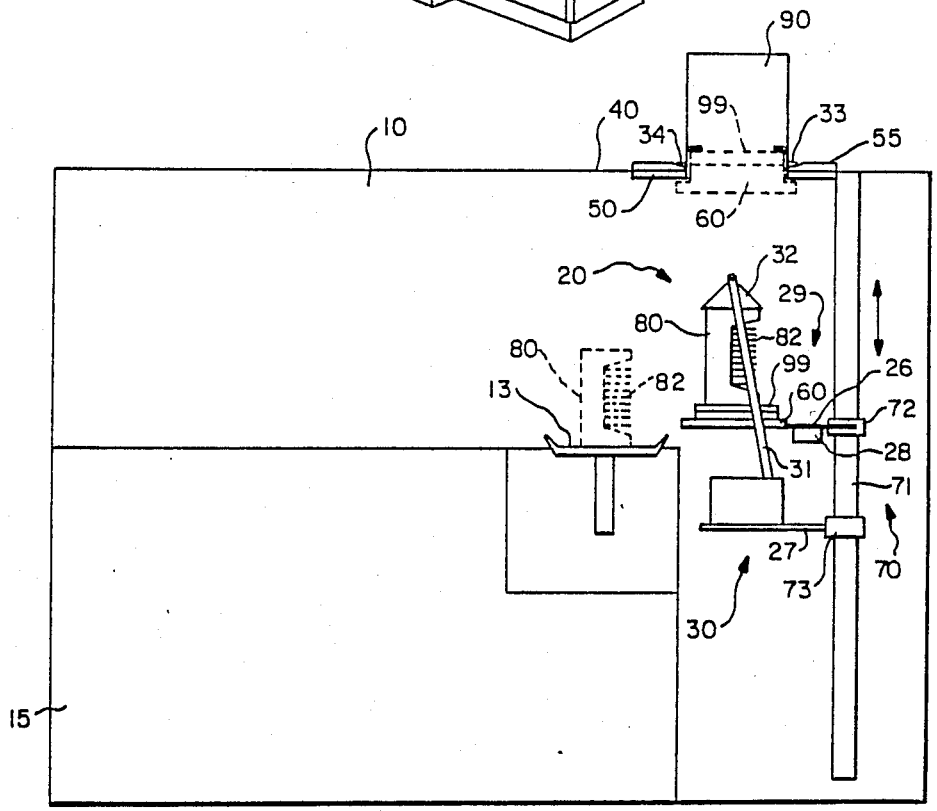
FIG.—2

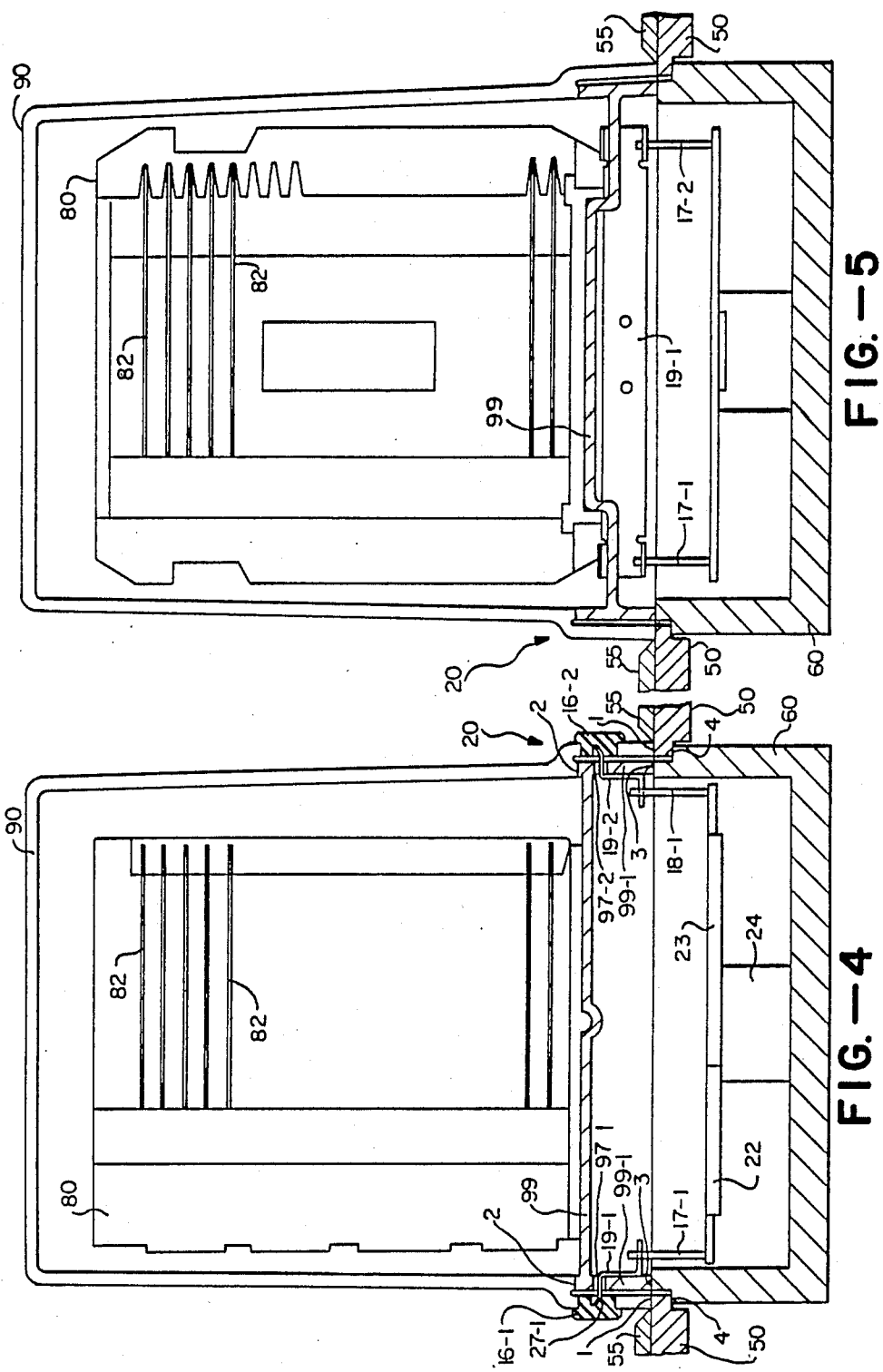

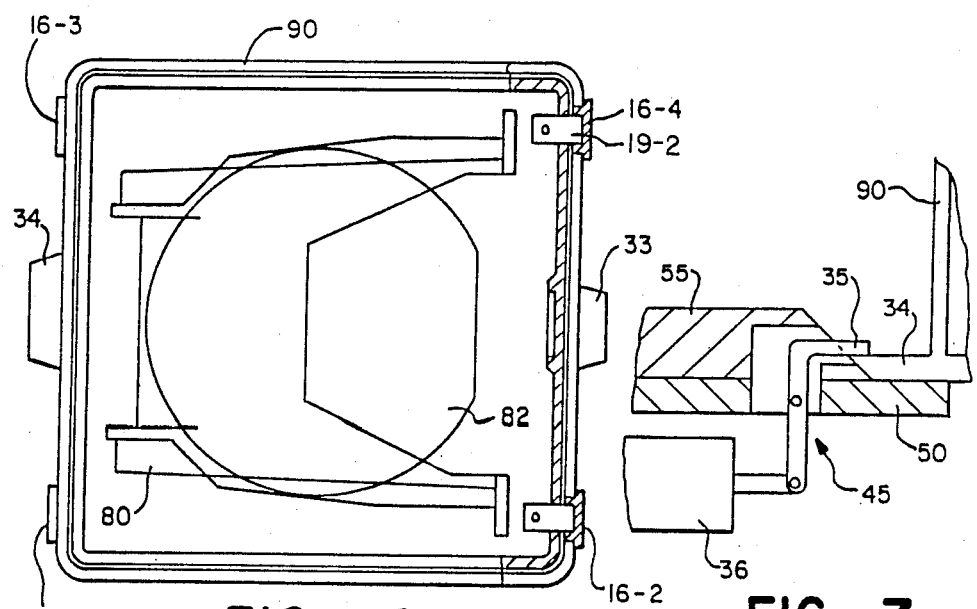
FIG.—6  FIG.—7
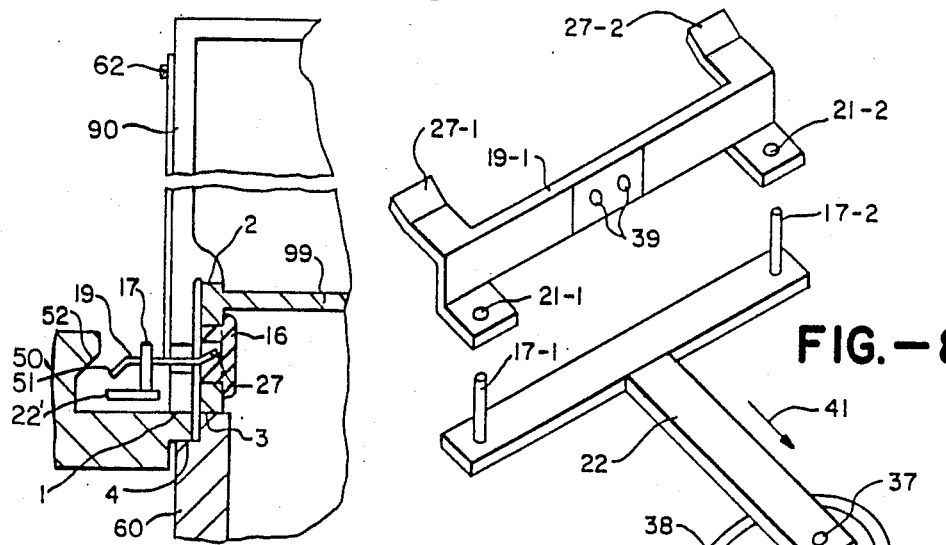
FIG.—15  FIG.—8
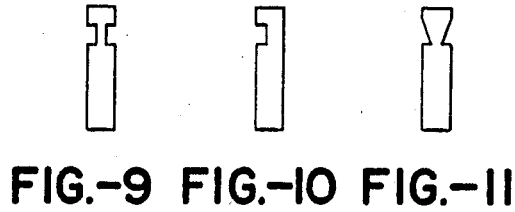
FIG.—9  FIG.—10  FIG.—11

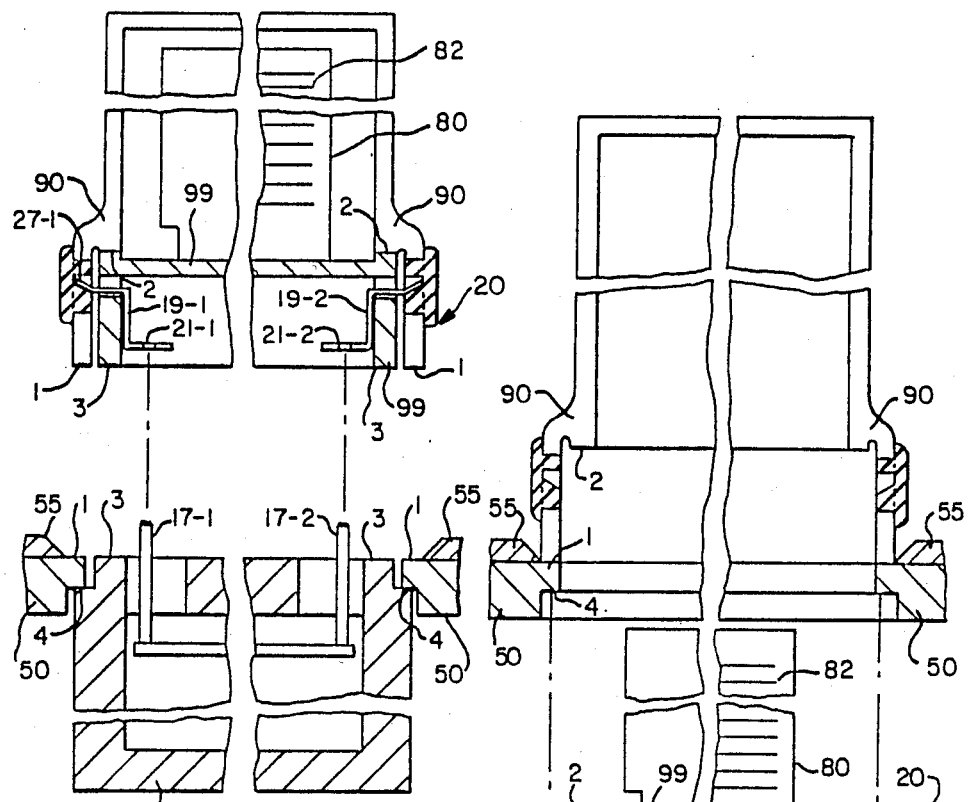
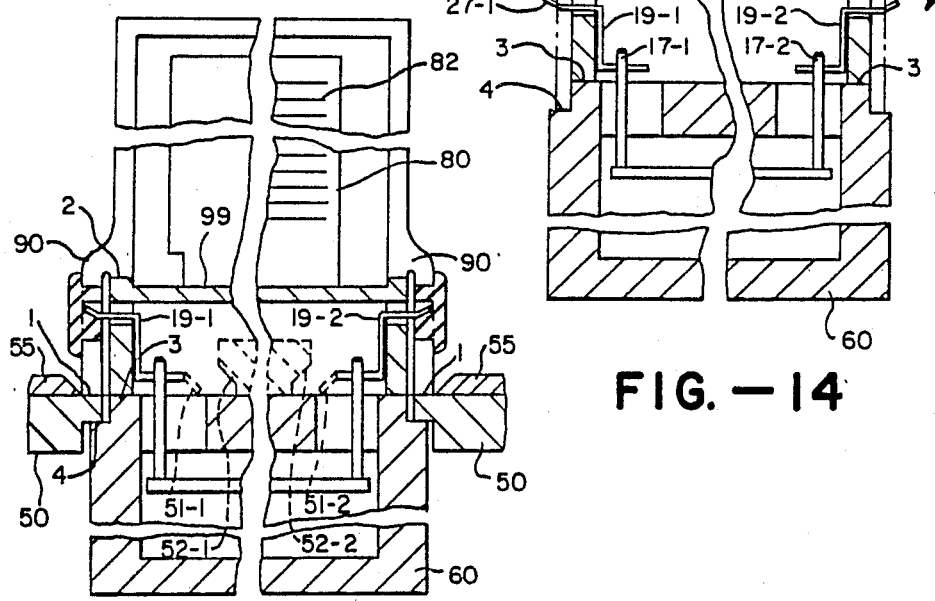
FIG.-12
FIG.-13
FIG.-14

SEALED STANDARD INTERFACE APPARATUS

BACKGROUND OF INVENTION

The present invention relates to standardized mechanical interface systems for reducing particle contamination and more particularly to apparatus employing sealed containers suitable for use in semiconductor processing equipment to prevent particle contamination.

A standardized mechanical interface (SMIF) has been proposed to reduce particle contamination by significantly reducing particle fluxes onto wafers. This end is accomplished by mechanically ensuring that during transport, storage and processing of the wafers, the gaseous media (such as air or nitrogen) surrounding the wafers is essentially stationary relative to the wafers and by ensuring that particles from the ambient outside environment do not enter the immediate internal wafer environment.

Control of particulate contamination is imperative for cost effective, high-yielding and profitable manufacturing of VLSI circuits. Because design rules increasingly call for smaller and smaller lines and spaces, it is necessary to exert greater and greater control on the number of particles and to remove particles with smaller and smaller diameters.

Some contamination particles cause incomplete etching in spaces between lines, thus leading to an unwanted electrical bridge. In addition to such physical defects, other contamination particles may cause electrical failure due to induced ionization or trapping centers in gate dielectrics or junctions.

The main sources of particulate contamination are personnel, equipment, and chemicals. Particles given off by personnel are transmitted through the environment and through physical contact or migration onto the wafer surface. People, by shedding of skin flakes, for example, are a significant source of particles that are easily ionized and cause defects. Although clean room garments reduce particle emissions they do not fully contain the emissions. It has been found that as many as 6000 particles per minute are emitted into an adjacent one cubic foot of space by a fully suited operator.

To control contamination particles, the trend in the industry is to build more elaborate (and expensive) clean rooms with HEPA and ULPA recirculating air systems. Filter efficiencies of 99.999% and up to ten complete air exchanges per minute are required to obtain an acceptable level of cleanliness.

Particles within the equipment and chemicals are termed "process defects." To minimize process defects, processing equipment manufacturers must prevent machine generated particles from reaching the wafers, and suppliers of gases and liquid chemicals must deliver cleaner products. Most important, a system must be designed that will effectively isolate wafers from particles during storage, transport and transfer into processing equipment. The Standard Mechanical Interface (SMIF) system has been proposed to achieve this goal.

The SMIF concept is based on the realization that a small volume of still, particle-free air, with no internal source of particles, is the cleanest possible environment for wafers. Further details of one proposed system are described in the article "SMIF: A TECHNOLOGY FOR WAFER CASSETTE TRANSFER IN VLSI MANUFACTURING", by Mihir Parikh and Ulrich Kaempf, *Solid State Technology*, July 1984, pp. 111–115.

The proposed SMIF system has three main components, namely, (1) minimum volume, dustproof boxes are used for storing and transporting wafer cassettes; (2) canopies are placed over cassette ports of processing equipment so that the environments inside the boxes and canopies become miniature clean spaces; (3) doors on the boxes are designed to mate with doors on the interface ports on the equipment canopies and the two doors are opened simultaneously so that particles which may have been on the external door surfaces are trapped ("sandwiched") between the doors.

In the proposed SMIF system, a box is placed at the interface port on top of the canopy; latches release the box door and the canopy port door simultaneously. A mechanical elevator lowers the two doors, with the cassette riding on top, into the canopy covered space. A manipulator picks up the cassette and places it onto the cassette port/elevator of the equipment. After processing, the reverse operation takes place.

The SMIF system has been proved effective by experiments using prototype SMIF components both inside and outside a clean room. The SMIF configuration achieved a ten-fold improvement over the conventional handling of open cassettes inside the clean room.

Modern processing equipment must be concerned with particle sizes which range from below 0.01 micrometers to above 200 micrometers. Particles with these sizes can be very damaging in semiconductor processing. Typical semiconductor processes today employ geometries which are 1 micrometer and under. Unwanted contamination particles which have geometries measuring greater than 0.1 micrometer substantially interfere with 1 micrometer geometry semiconductor devices. The trend, of course, is to have smaller and smaller semiconductor processing geometries.

In typical processing environments today, "clean rooms" are established in which, through filtering and other techniques, attempts are made to remove particles having geometries of 0.03 micrometer and above. There is a need, however, to improve the processing environment. The conventional "clean room" cannot be maintained as particle free as desired. It is virtually impossible to maintain conventional clean rooms free of particles of a 0.01 micrometer size and below.

For this reason, systems such as the SMIF system have come under consideration. The proposed SMIF systems, however, have not been fully satisfactory. The SMIF systems which have been proposed have not permitted a full seal to be maintained between the interior of the box and the interior of the canopy during a cassette transfer. The mechanisms for latching and unlatching both the doors have not been convenient and adequate for making the cassette transfer. Accordingly, there is a need for improved mechanisms.

In accordance with the above background, there is a need for an improved system which can be standardized and which is effective for reducing the contamination caused by submicron particles.

SUMMARY OF THE INVENTION

The present invention is an apparatus for maintaining articles, such as semiconductor wafers clean. The wafers or other articles to be processed are placed in a box having first and second regions for making first and second seals. A box door seals the articles into the box. The box has a second region for making the second seal and has a third region for making a third seal. The box is used to transport the wafers to a port in the canopy of the processing equipment. The port is adapted for receiving the box and box door and for transferring the box door and the contents of the box into a region beneath the canopy. The canopy has a first region for making the first seal with the box. Also, the port has a fourth region surrounding the port opening for making a fourth seal. A port door is provided for closing the port when no box is present. The port door has a second region for making the second seal with the box and has a fourth region for making the fourth seal with the port. A box door latch is provided for latching the box door to the box whereby the second seal is made and released in the second region between the box door and the box by operation of the box door latch. A box latch is provided for latching the box to the port whereby the first seal is made or released in the first region between the box and the port by the operation of the box latch.

In one particular embodiment, the first and second regions where first and second seals are made on the box are spaced apart and the box door latch operates between the walls of the box and the box door in the space between the first and second regions. The box door latch need only be operated to release the second seal after the first seal has been engaged. In one embodiment the box door latch mechanism is operated from inside the latch door in an internal space, through the latch door wall to the box wall and no opening to the outside environment occurs as a result of the box door latch mechanism or its operation.

In one particular embodiment of the invention, the box door latch includes spring loaded latches which are normally closed to latch the box door to the box. The springs are engaged and disengaged by spring actuators contained within the port door mechanism whenever the box and box door are placed upon or are removed from the canopy port.

The various embodiments of the invention the springs and other latch mechanism from the clean regions to regions which, although contaminated, do not affect the clean regions thereby providing improved interface mechanisms.

Additional objects and features of the invention will appear from the following description in which the preferred embodiments of the invention have been set forth in detail in conjunction with the drawings.

BRIEF SUMMARY OF THE DRAWINGS

FIG. 1 depicts a perspective view of the SMIF system positioned adjacent processing equipment.

FIG. 2 depicts a schematic representation of the SMIF system and the processing equipment of FIG. 1.

FIG. 4 depicts a front view of the SMIF box and a portion of the port assembly.

FIG. 5 depicts a side view of the FIG. 4 apparatus.

FIG. 6 depicts a top view of the FIG. 4 apparatus.

FIG. 7 depicts a front view of the box latch mechanism by which the box is latched to the port plate of the canopy of FIG. 2.

FIG. 8 depicts a perspective view of the solenoid and connecting mechanism which actuates the box door latch springs.

FIGS. 9–11 depict various different pins which are employed as alternatives for the pins of FIG. 8.

FIG. 12 depicts an exploded partial sectional front view of the port assembly with the box and box door positioned above the port with the port door closed.

FIG. 13 depicts a cross-sectional side view of the FIG. 12 apparatus when the box and box door have been positioned on the port plate so that all seals are closed.

FIG. 14 depicts the apparatus of FIG. 13 in an exploded view with the box door and the port door connected and withdrawn to open the port.

FIG. 15 depicts an alternate embodiment of the box door latch mechanism.

DETAILED DESCRIPTION

Figure 3:
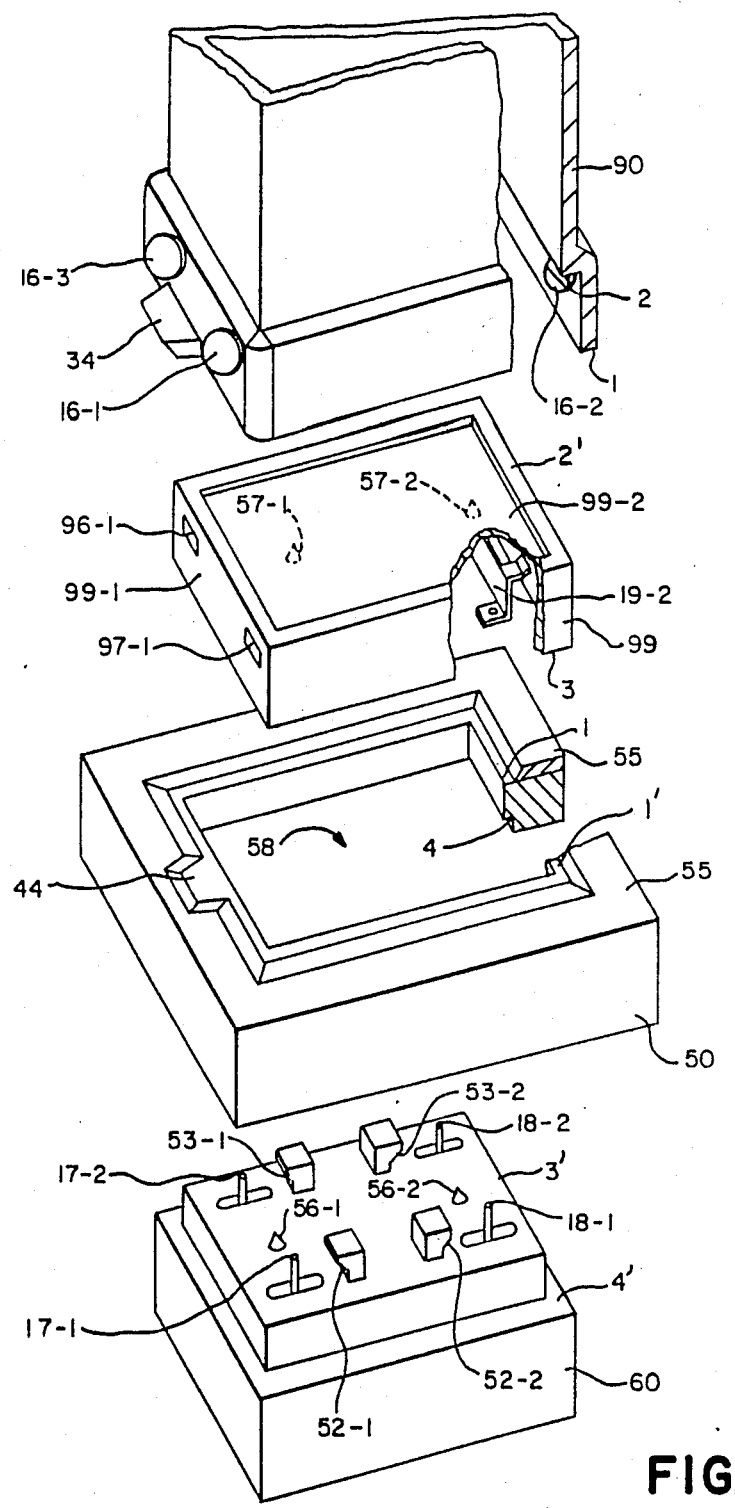
FIG. 3 depicts an exploded perspective view of a port assembly of the present invention.

In FIG. 1, a canopy 10 is an easily removable shield that covers the wafer-handling mechanisms of the processing equipment 15. Equipment 15 is a photoresist applicator, mask aligner, inspection station, or any similar processing equipment. The canopy 10 is constructed of transparent plastic such as Lexan to facilitate inspection and/or maintenance within the canopy 10. The canopy 10 encloses the handling mechanisms of the processing equipment 15 and a wafer cassette 80 holding wafers 82 and therefore the equipment 15 need not be installed in a clean room.

FIG. 2 shows further details of the FIG. 1 apparatus. A box 90 is mounted on an horizontal surface 40 of the canopy 10 by means of a part plate 50. A port assembly 20 further includes a port door 60 and an elevator mechanism 70 that transports the cassette 80, containing the integrated circuit wafers 82, from the box 90 into the region beneath the canopy 10. In FIG. 2, the port door 60 and the box door 99 are shown in the closed positions by broken lines and are shown in the open position by solid lines. A mover assembly 29 includes a platform 26, a shaft engagement means 72, and a drive motor 28.

The platform 26, extending from the elevator assembly 70, carries the port door 60, the box door 99, and the cassette 80 in a vertical direction. The platform 26 is attached by engagement means 72 to a vertical guide 71 of elevator assembly 70. Typically, guide 71 includes a lead screw (not shown) and motor 28 drives a gear (not shown) which engages the lead screw for driving the platform 26 up or down. When platform 26 is driven to the closed position, the port door 60 closes the port opening in the canopy 10.

In a similar manner, a manipulator assembly 30 is fastened to a platform 27 which has an engagement means 73 for engaging the vertical shaft assembly 71. Manipulator 30 includes a manipulator arm 31 and an engagement head 32 adapted to engage the cassette 80. By vertical operation of the platforms 26 and 27 and operation of the manipulator 30, the cassette 80 is moved from its position on the box door 99 to a position on the equipment station 13 (as shown by the broken lines).

In FIG. 3, an exploded, perspective view of the port assembly 20 is shown in further detail. The box 90 defines a first region 1 and a second region 2 where first and second seals are to be made with a port plate 50 and the box door 99, respectively. The box 90 includes an alignment tab 34 which is received by the alignment opening 44 in a guide rail 55 which forms part of the port plate 50.

In FIG. 3, the box door 99 has a vertical wall 99-1 and a horizontal wall 99-2. The vertical wall has openings 97-1 and 96-1 which are aligned with plugs 16-1 and 16-3, respectively. The wall 99-1 extends generally around the perimeter and is terminated at one end by a region 2' and at the other end by a region 3. Typically, the regions 2' and 3 can be machined so that the region 2' falls in one plane and the region 3 falls in another plane parallel to the plane of region 2'. The wall 99-2 extends perpendicular to the wall 99-1 and is enclosed around its perimeter by the region 2'. Within the wall 99-2, on the underside, are cone shaped receptors 57-1 and 57-2 which are alignment cones for receiving the cones 56-1 and 56-2 which protrude from the port door 60.

In FIG. 3, the port plate 50 and the guide rail 55 surround the port opening 58. Around the perimeter of the port opening is the region 1 on the surface 40 adjacent the guide rail 55. The region 1' in the port plate 50 is adapted to receive the region 1 of the box 90.

In FIG. 3, the opening 58 is large enough such that the box door 99 will slide through the opening with a clearance distance. When assembled together, the region 3 which is the bottom end of the wall 99-1 extends to the opening 58 to mate with the region 3' around the raised portion of the port door 60. The region 4' of the port door 60 is designed to mate with the region 4 of the port plate 50 to form a fourth seal.

The port door 60 includes four actuator pins 17-1, 17-2, 18-1 and 18-2. These pins extend above the plane of the region 3 so as to extend above the horizontal surface 40 and align with springs, such as the spring 19-2 attached to the vertical wall 99-1 of the box door 99.

In FIG. 4, further details of the port assembly 20 are shown. The box 90 forms a first seal at region 1 on the top surface of the mounting plate 50. The box 90 forms a second seal at region 2 between the box 90 and the box door 99. The box door 99 forms a second seal at region 2 with the box 90 and forms a third seal a region 3 with the port door 60. The port door 60 forms a fourth seal at region 4 with a fourth region on the port plate 50. These four regions 1, 2, 3 and 4 extend around the entire circumference of the box and enclose the port opening 58. Accordingly, the box 90 and the canopy 10 can be under vacuum or pressure.

The box door 99 has a vertical wall 99-1 having an opening 97-1. A spring 19-1 extends through the opening 97-1 in wall 98 and engages a registration plug 16-1. When the tip 27-1 of spring 19-1 engages the plug 16-1, the box door 99 is held engaged with the box 90 so that a good seal is made in the region 2. As shown in FIG. 4, the spring 19-2 engages the plug 16-2.

The springs 19-1 and 19-2 are, by spring operation, held engaged. To disengage the springs 19-1 and 19-2, a solenoid 24 is actuated causing translational movement of actuating arms 22 and 23 as described more fully with respect to FIG. 8. The verical pin 17-1, connecting through a hole in spring 19-1, and vertical pin 18-1, connecting through a hole in spring 19-2, operate to withdraw the springs from the plugs 16-1 and 16-2. When withdrawn, the box door 99 can be separated from the box 90.

In FIG. 5, the spring 19-1 of FIG. 4 includes two ends, one for receiving the pin 17-1 and the other for receiving the pin 17-2. In the embodiment described, there are a total of four pins 17-1, 17-2, 18-1 and 18-2 and corresponding plugs 16-1 through 16-4 (not all shown). Accordingly, the box door 99 is held in position at four locations.

In FIG. 6, a top view of the port assembly 20 of FIG. 4 is shown. The pins 18-1 and 18-2 extend into the plugs 16-1 and 16-4. In FIG. 6, only a partial cut-away view is shown so that the spring 19-2 is shown but the spring 19-1 is not.

In FIG. 6, tab 33 is shown on one side of box 90 and a larger tab 34 is shown on the other side. Tabs 33 and 34 are shaped and have different sizes so that the box 90 cannot be placed with the wrong orientation into the port. Tabs 33 and 34 fit into tab guides 43 and 44 which are located on the port plate 50 of FIG. 2. Additionally, the tabs 33 and 34 are engaged by box latches for holding the box 90 engaged to the port plate 50.

In FIG. 7, further details of the box latch 45 engaging the tab 34 are shown. A latch arm 35 is pivoted by an actuator 36. When actuator 36 is energized, arm 35 is pivoted back to clear tab 34 allowing tab 34 to be moved vertically past the arm 35. When actuator 36 is disengaged, arm 35 is spring loaded to clamp tab 34 thereby making the first seal in region 1. A similar mechanism like that of FIG. 7 is included for the tab 33 and operates in the same way.

In FIG. 8, further details of the box door latch mechanism are shown. The solenoid 24 is rotatable and engages, through pins 37 and 38, slots in the arms 22 and 23, respectively. When the solenoid 24 is actuated clockwise, arms 22 and 23 translate in the directions of arrows 41 and 42, respectively. When the arm 22 translates, the pins 17-1 and 17-2, which are engaged through holes 21-1 and 21-2 to the ends of spring 19-1, cause the spring tips 27-1 and 27-2 to be retracted. Spring 19-1 is rigidly connected, through mounting holes 39, to the vertical wall 99-1 of box door 99 as shown in FIG. 4.

When the solenoid 24 is actuated, the center of the spring 19-1 (near holes 39) remains stationary while the ends including the tips 27-1 and 27-2 are retracted outward by operation of the translation of arm 22.

In FIG. 8, the pins 17-1 and 17-2 are shown as cylinders. In FIGS. 9, 10 and 11, a slotted-head pin, a single-sided slot pin, and a bevel slotted pin are shown and are alternatives for the pins 17-1 and 17-2. These pins engage the walls of the holes 21-1 and 21-2 to ensure proper operation. The holes 21-1 and 21-2 are somewhat larger then the pins in order to provide easy clearance when the box 90 and box door 99 are placed onto and removed from the port plate 50.

In FIG. 12, a partially cut-away exploded view of the FIG. 4 port assembly 20 is shown with the box 90, with the box door 99 closed, located above the port plate 50. The pins 17-1 and 18-1 do not extend through the holes in the springs 19-1 and 19-2. The springs 19-1 and 19-2 are in their relaxed position and hold the box door 99 against the box 90 so that the second seal in the region 2 is firmly made. However, no seal is made in the region 1 and the region 3. In FIG. 12, the port door is similarly firmly pushed against the port plate 50, for example by operation of the elevator platform 26 in FIG. 2, so that the fourth seal in the region 4 is firmly made.

In FIG. 13, the box 90 and box door 99 from FIG. 12 have been placed down on top of the port plate 50, and the box latches of the FIG. 7 type have been actuated so that the seals in the regions 1 are firmly made. In FIG. 13, all of the seals in the regions 1, 2, 3 and 4 are firmly made. At this time, the box door latch mechanism of FIG. 8 is actuated retracting the tips of the springs 19-1 and 19-2. Thereafter the elevator 70 of FIG. 2 is actuated to withdraw the box door 99, the port door 60, and the cassette 80 including the wafers 82 down and out of the box 90.

In FIG. 14, the port assembly 20 is shown with the cassette 80 withdrawn from the box 90 at a time when the solenoid has been released and the springs 19-1 and 19-2 have been returned to their relaxed position. At this time, the cassette 80 by operation of the manipulator assembly 30 of FIG. 2 can be removed from the box door 99 to any suitable position in the processing equipment 15.

In FIG. 14, the seal 3 between the box door 99 and the port door 60 is made by the weight of gravity and no positive sealing latch mechanism is shown.

In an alternative embodiment as shown by broken lines in FIG. 13, the springs 19-1 and 19-2 are extended by tips 51-1 and 51-2 so that when in the retracted position they engage a wall 52-1 or 52-2 of the port door 60. When the solenoid is actuated, the springs 19-1 and 19-2 release the box door 99 from the box 90 while at the same time engaging the springs 19-1 and 19-2 to the port door 60. This creates positive engagement of the seals in all of the regions 1, 2, 3 and 4 by positive latching forces. These seals permit a differential pressure, either a vacuum or a positive pressure, to be employed.

In FIG. 15, an alternate embodiment of the box door latch mechanism is shown. The spring 19 extends vertically along the wall of the box 90 and is connected to box 90 by the bolt 62. Spring 19 can be actuated from right to left by operation of the pin 17 which is translated by an arm 22'. The arm 22' is connected to a solenoid or other electrical actuating mechanisms. When the spring 19 is actuated and moved from right to left, the tip 51 engages the inclined face 52 which is attached to the port plate 50. In this way, when the spring 19 is actuated, the box door 99 is released when tip 27 is withdrawn and the box 90 is securely held to the port plate 50 thereby making a seal in the region 1 between the box 90 and the port plate 50.

In order to provide additional sealing a seal material is positioned in region 1 between the box 90 and the port plate 50. A second seal material is positioned at the second region between the box 90 and the box door 99. A third seal material is positioned at the region 3 between the box door 99 and the port door 60. Additional seal material is positioned between region 4 between the port plate 50 and the port door 60. Although not shown, it is preferable that the first and third seal material be of corrugated plastic while the second seal material be formed by a labyrinth formation and fourth seal material comprise an o-ring.

While the invention has been particularly shown and described with reference to preferred embodiments thereof, it will be understood by those skilled in the art that the foregoing and other changes in form and detail may be made therein without departing from the spirit and scope of the invention.

What is claimed is:

1. An apparatus for maintaining articles to be processed in substantially particle free environment comprising,
    a box for containing said articles, said box having first and second regions for making first and second seals,
    a box door having a second region for making said second seal and having a third region for making a third seal,
    port means adapted for receiving said box and box door and including further means for transferring the box door and said articles into a clean region, said port means having a first region for making said first seal and having a fourth region for making a fourth seal,
    a port door having a second region for making said second seal and having a fourth region for making a said fourth seal,
    box door latch means for latching said box door to said box whereby said second seal is made and released in the second region between said box and said box door by operation of said box door latch means; and
    the port door including means for activating said box door latch means;
    wherein said first and second regions are displaced in space;
    wherein said latch means operates in the space between said first and second regions;
    wherein said box has a box opening defined by said second region; and
    wherein said box door functions to close said opening by making said second seal in said second region, said box door having a first wall extending between said first and said third regions extending generally around the perimeter of said box opening and having a second wall connected to said first wall and supporting said second region, said first and second walls defining an internal space generally surrounded by said second region, said box door latch means further including retention means extending through said first wall into said box for holding said box door stationary with respect to said box thereby closing said box opening.

2. The apparatus of claim 1 wherein said box door latch means is located within said internal space.

3. The apparatus of claim 1 wherein said retention means includes a spring for latching said box to said box door.

4. The apparatus for claim 3 wherein said box door latch means includes an electrically operated actuator for actuating said spring for disengaging said spring from said box whereby said box door can be removed to open said box.

5. The apparatus of claim 4 wherein said spring includes a clearance hole and wherein said actuator means includes a pin for insertion into said clearance hole whereby operation of said actuator functions to move said spring for disengaging said box and said box door.

6. The apparatus of claim 1 wherein said box door has a cross-section in the shape of an H, wherein said second region is defined as the top of the vertical walls of said H and wherein said third region is defined at the bottom of said vertical sides of said H whereby said first and second regions lines in parallel planes.

7. The apparatus of claim 6 wherein said box door and said port door each include alignment members which cooperate to align said port door and said box door whenever said third seal is made.

8. The apparatus of claim 1 wherein said box includes box alignment means and wherein said port means includes port alignment means adapted for receiving said box alignment means whereby said box is aligned with said port plate by cooperation of said alignment means.

9. The apparatus of claim 8 wherein the distance between said first and second regions of said box defines a box offset and wherein the distance between said second and third regions of said box door defines a box door offset and wherein said box offset is equal to said box door offset whereby said first and third regions lie substantially in the same plane when said box door has said second seal made to close said box opening.

10. The apparatus of claim 1 further including box latch means for latching said box to said port means whereby said first seal is made or released in said first region by the operation of said box latch means.

11. The apparatus of claim 1 wherein said port means is included within semiconductor processing equipment having a canopy for protecting semiconductor wafers and wherein said articles are semiconductor wafers.

* * * * *

UNITED STATES PATENT AND TRADEMARK OFFICE
CERTIFICATE OF CORRECTION

PATENT NO. : 4,674,939
DATED : June 23, 1987
INVENTOR(S) : George A. Maney; Andrew W. O'Sullivan; W. George Faraco It is certified that error appears in the above-indentified patent and that said Letters Patent is hereby corrected as shown below:

```
Column 2, line 66:  after "box" insert --door--.
Column 3, line 8:   "second" should read --third--.
Column 3, line 9,   "second" should read --third--.
Column 3, line 9:   after "box" insert --door--.
Column 4, line 25:  "part" should read --port--.
Column 5, line 32:  "seal a" should read --seat at--.
Column 7, line 67:  "second" should read --third--.
Column 7, line 68:  "second" should read --third--.
Column 7, line 69:  delete "a".
Column 8, line 15:  "first" should read --second--.
```

In the Abstract:
   Line 6:  after "box" insert --door--.
   Line 17: both occurrences of "second" should read --third--.
   Line 17: after "box" insert --door--.

Signed and Sealed this

Seventh Day of July, 1998

Attest:

BRUCE LEHMAN

*Attesting Officer*      *Commissioner of Patents and Trademarks*